(12) United States Patent
Lee

(10) Patent No.: US 7,724,050 B2
(45) Date of Patent: May 25, 2010

(54) DELAY LOCKED LOOP CIRCUIT AND CONTROL METHOD OF THE SAME

(75) Inventor: Kwang-Su Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/169,560

(22) Filed: Jul. 8, 2008

(65) Prior Publication Data

US 2009/0167388 A1     Jul. 2, 2009

(30) Foreign Application Priority Data

Dec. 28, 2007    (KR) .................... 10-2007-0139829

(51) Int. Cl.
  *H03L 7/06* (2006.01)
(52) U.S. Cl. ..................... 327/158; 327/149
(58) Field of Classification Search .............. None
  See application file for complete search history.

(56) References Cited

U.S. PATENT DOCUMENTS

| 6,483,359 | B2 * | 11/2002 | Lee | ............ 327/158 |
| 6,822,494 | B2 | 11/2004 | Kim | |
| 6,853,226 | B2 | 2/2005 | Kwak et al. | |
| 6,943,602 | B1 | 9/2005 | Lee | |
| 7,034,590 | B2 * | 4/2006 | Shin | ............ 327/158 |
| 7,372,311 | B2 | 5/2008 | Kang | |
| 2007/0152723 | A1 | 7/2007 | Ahn et al. | |
| 2008/0001642 | A1 * | 1/2008 | Yun et al. | ............ 327/161 |

FOREIGN PATENT DOCUMENTS

JP    2005-020686    1/2005
KR    1020050005889 A    1/2005

* cited by examiner

*Primary Examiner*—Cassandra Cox
(74) *Attorney, Agent, or Firm*—Baker & McKenzie LLP

(57) ABSTRACT

A delay locked loop capable of preventing delay locking time from being increased, even if the operational environment fluctuates. The delay locked loop circuit includes a delay line for delaying and outputting a reference clock signal, a phase detection unit for detecting a phase difference between the reference clock signal and an output signal of the delay line and then outputting a phase detection signal and a first delay mode decision signal, a control unit for outputting a delay control signal to control the delay line according to the phase detection signal and a second delay mode decision signal, and an error decision unit for detecting an error of the first delay mode decision signal according to the delay control signal and the output signal of the delay line and outputting the second delay mode decision signal according to a result of the error detection.

14 Claims, 4 Drawing Sheets

DELAY LOCKED LOOP CIRCUIT AND CONTROL METHOD OF THE SAME

CROSS-REFERENCES TO RELATED APPLICATION

The present application claims priority under 35 U.S.C. 119(a) to Korean application number 10-2007-0139829, filed on Dec. 28, 2007, in the Korean Intellectual Property Office, which is incorporated by reference in its entirety as if set forth in full.

BACKGROUND

1. Technical Field

The embodiments described herein relate to a semiconductor circuit technology and, more particularly, to a delay locked loop and a method for controlling the same.

2. Related Art

Generally, a delay locked loop (DLL) is a circuit for synchronizing a phase of an external clock signal, which is supplied from outside of a semiconductor memory device, with a phase of an internal clock signal, which is used within the semiconductor memory device.

Referring to FIG. 1, a conventional delay locked loop circuit includes a differential amplifier 10, a delay line 20, a replica delay 30, a phase detecting unit 40, a control unit 50, and a drive 60.

The delay line 20 includes a coarse delay line 21 and a fine delay line 22. The delay value set up in a unit delayer of the fine delay line 22 is smaller than that set up in a unit delayer of the coarse delay line 21.

The replica delay 30 is a delay circuit for providing a delay time, which is the same as the signal processing time in the semiconductor circuit. The replica delay 30 outputs to the phase detecting unit 40 a feedback clock signal 'FBCLK' which is produced by delaying a delay signal 'MIXOUT' of the delay line 20 by a predetermined delay time.

The phase detecting unit 40 outputs a phase detection signal 'POUT' and a delay mode decision signal 'COARSE_LOCK' to the control unit 50, by detecting a phase difference between a reference clock signal outputted from the differential amplifier 10 and the feedback clock signal 'FBCLK'.

The delay mode decision signal 'COARSE_LOCK' is a signal that informs of the completion of the DLL operation using the coarse delay line 21. That is, it is a signal to inform that the time difference between two signals to be delay-locked is smaller than the delay time of the unit delayer in the coarse delay line 21, while the DLL operation is executed by the coarse delay line 21.

The control unit 50 varies the total delay time of the delay line 20 by controlling the coarse delay line 21 or the fine delay line 22 of the delay line 20 according to the phase detection signal 'POUT' and the delay mode decision signal 'COARSE_LOCK'.

The control unit 50 is implemented to control the delay line 20 in two modes. Initially, the DLL operation is carried out by controlling the coarse delay line 21. Thereafter, when the delay mode decision signal 'COARSE_LOCK' is activated, the DLL operation is carried out by controlling the fine delay line 22.

The driver 60 outputs a delay locking signal by driving the delay signal 'MIXOUT' of the delay line 20.

The DLL operation using the fine delay line 22 is shown in FIG. 2. That is, two output signals 'FCLK' and 'SCLK' from the coarse delay line 21 are respectively output with a time difference, which corresponds to a half of the delay time in the unit delayer.

The fine delay line 22 carries out the DLL operation in such a manner that the delay time is finely adjusted by making these two signals 'FCLK' and 'SCLK' different in a mixture rate.

In normal operation environments, when the delay signal 'MIXOUT' of the fine delay line 22 has a value that corresponds to a point of (A0), it is assumed that the delay is locked.

Meanwhile, in case that the operational parameters, such as temperature, voltage or operating frequency, are changed, the delay can be locked when the delay signal 'MIXOUT' of the fine delay line 22 has a value corresponding to the point of (A1), not at the value corresponding to the point of (A0), due to the phase distortion of the two signals.

However, it takes a lot of time to adjust the delay signal 'MIXOUT' of the fine delay line 22 so that the delay signal 'MIXOUT' has the value that corresponds to the point of (A1).

As mentioned above, a conventional delay locked loop circuit needs a lot of time to execute the DLL operation using the fine delay line 22 when the operational parameters change. Furthermore, in such circumstances, an error can be caused in the DLL operation because the DLL operation cannot conform to the operating standards of the semiconductor memory device.

SUMMARY

A delay locked loop capable of preventing a delay locking time from being increased, even if the operational environment fluctuates, and a method for controlling the same are described herein.

According to one aspect, a delay locked loop circuit comprising a delay line for delaying and outputting a reference clock signal, a phase detection unit for detecting a phase difference between the reference clock signal and an output signal of the delay line and then outputting a phase detection signal and a first delay mode decision signal, a control unit for outputting a delay control signal to control is the delay line according to the phase detection signal and a second delay mode decision signal, and an error decision unit for detecting an error of the first delay mode decision signal according to the delay control signal and the output signal of the delay line and outputting the second delay mode decision signal according to a result of the error detection.

According to another aspect, a method for controlling a delay locked loop circuit comprises executing a first DLL operation by controlling one of a plurality of delay lines, deciding whether the first DLL operation is completed within a predetermined time, and executing a second DLL operation by controlling another of the plurality of the delay lines when the first DLL operation is not completed within the predetermined time.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

A delay locked loop circuit configured according to the embodiments described herein can make it possible to execute the DLL operation stably and swiftly, even in the face of variations in operational environment.

Figure 1:
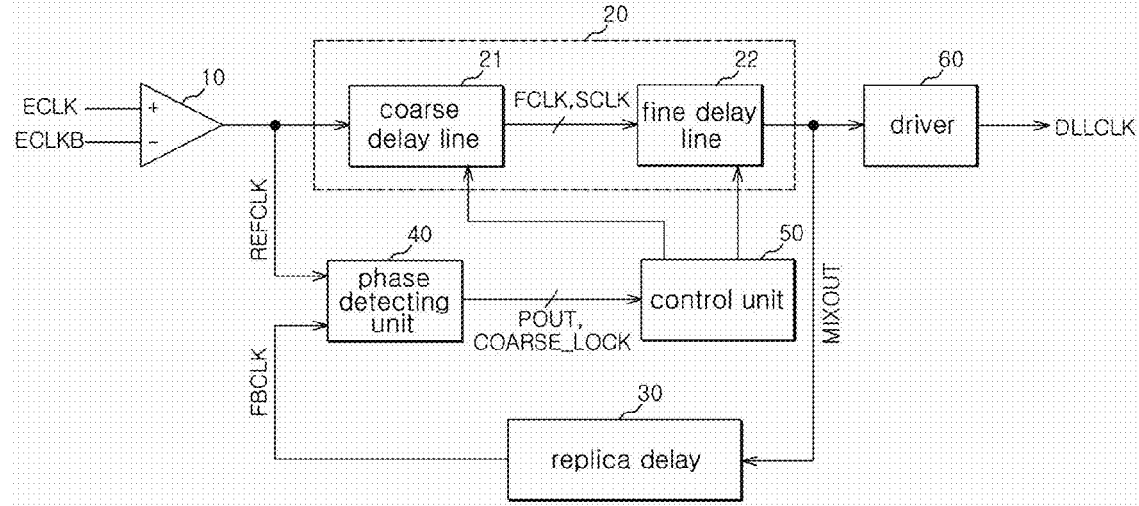
FIG. 1 is a block diagram illustrating a conventional delay locked loop circuit.
Figure 2:
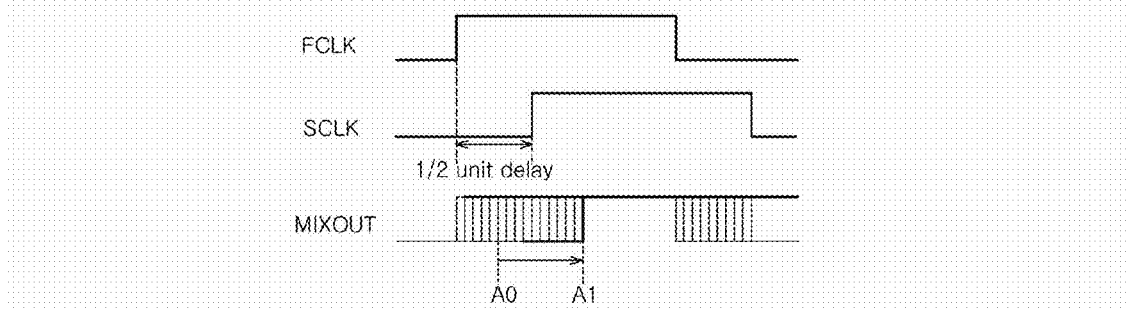
FIG. 2 is a timing chart showing a delay line control error for the circuit of FIG. 1, which is caused by a variation in operation environments.
Figure 3:
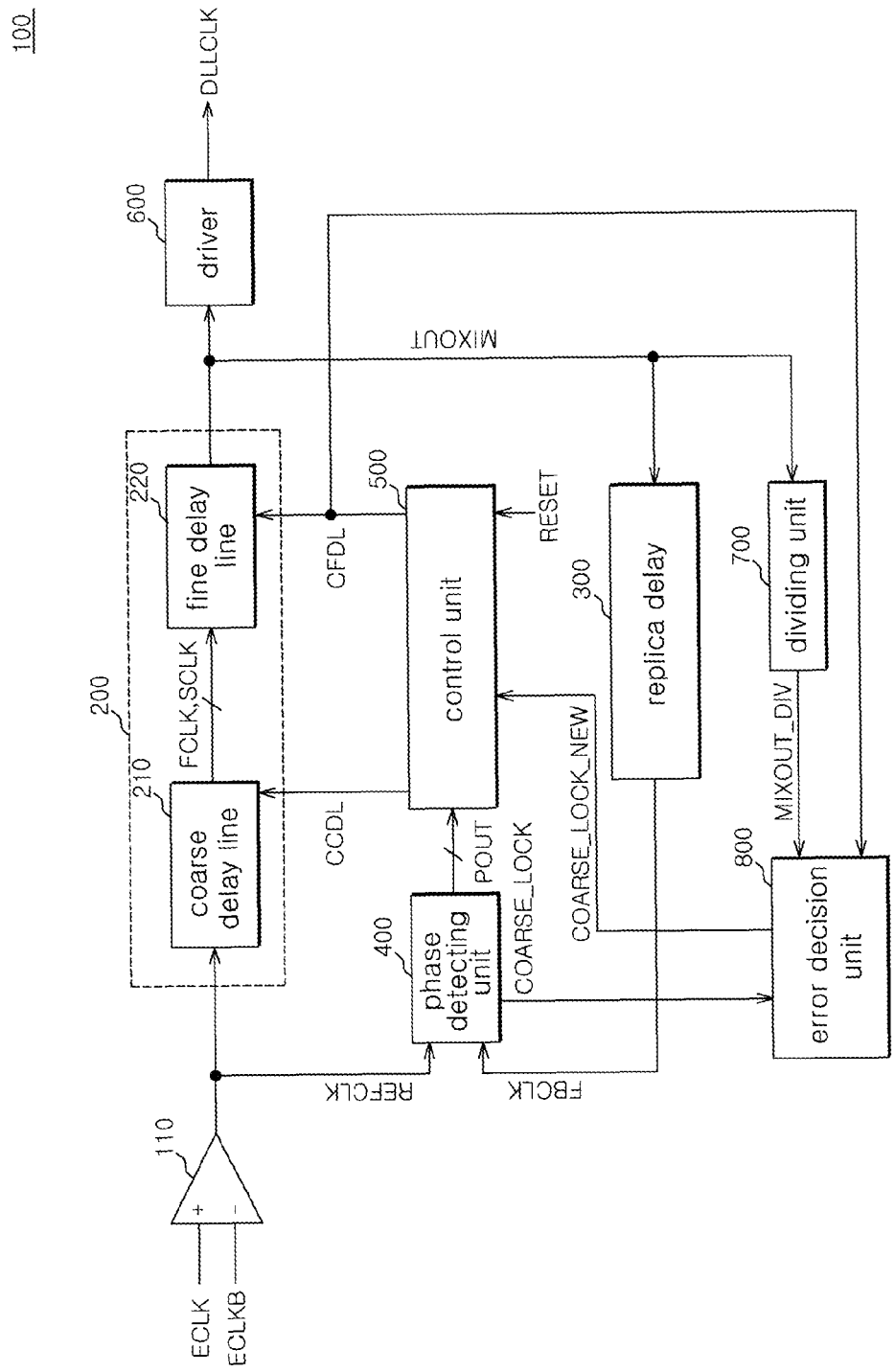
FIG. 3 is a block diagram illustrating a delay locked loop circuit according to one embodiment.

FIG. 3 is diagram illustrating a delay locked loop circuit 100 configured in accordance with one embodiment. As shown in FIG. 3, the delay locked loop circuit 100 can include a differential amplifier 110, a delay line 200, a replica delay 300, a phase detecting unit 400, a control unit 500, a driver 600, a dividing unit 700 and an error decision unit 800.

The delay line 200 can include a coarse delay line 210, which can include a unit delayer (not shown) and a fine delay line 220, which can include a unit delayer (not shown). The delay value set up in the unit delayer of the fine delay line 220 can be smaller than that set up in the unit delayer of the coarse delay line 210.

The replica delay 300 can be a delay circuit configured to provide a delay time that is the same as signal processing time in the semiconductor circuit. The replica delay 300 can be configured to output a feedback clock signal 'FBCLK', which is produced by delaying a delay signal 'MIXOUT' of the delay line 200 by a predetermined delay time, to the phase detecting unit 400.

The phase detecting unit 400 can be configured to output a phase detection signal 'POUT' and a first delay mode decision signal 'COARSE_LOCK', by detecting a phase difference between a reference clock signal 'REFCLK' output from the differential amplifier 10 and the feedback clock signal 'FBCLK'.

The first delay mode decision signal 'COARSE_LOCK' can be a signal that informs of the completion of the DLL operation using the coarse delay line 210. That is, it is a signal to inform that the time difference between two signals to be delay-locked is smaller than the delay time of the unit delayer in the coarse delay line 210, while the DLL operation is executed using the coarse delay line 210.

The control unit 500 can be configured to output delay control signals 'CCDL' and 'CFDL' according to the phase detection signal 'POUT' and a second delay mode decision signal 'COARSE_LOCK_NEW' in order to control the coarse delay line 210 and the fine delay line 220.

The control unit 500 can be configured to control the delay line 200 in two modes. Initially, the DLL operation can be carried out by outputting the delay control signal 'CCDL' and controlling the coarse delay line 210. Thereafter, when the second delay mode decision signal 'COARSE_LOCK_NEW' is activated, the DLL operation can be carried out by outputting the delay control signal 'CFDL' and controlling the fine delay line 220.

The driver 600 can be configured to output a delay locking clock signal 'DLLCLK' by driving the delay signal 'MIXOUT' of the delay line 200.

The dividing unit 700 can be configured to divide the delay signal 'MIXOUT' at a predetermined division rate, thereby outputting a divided signal 'MIXOUT_DIV'.

The error decision unit 800 can be configured to decide whether there is an error in the first delay mode decision signal 'COARSE_LOCK' based on the delay control signal 'CFDL' and the divided signal 'MIXOUT_DIV', and then output the second delay mode decision signal 'COARSE_LOCK_NEW' based on the result of the decision.

Figure 4:
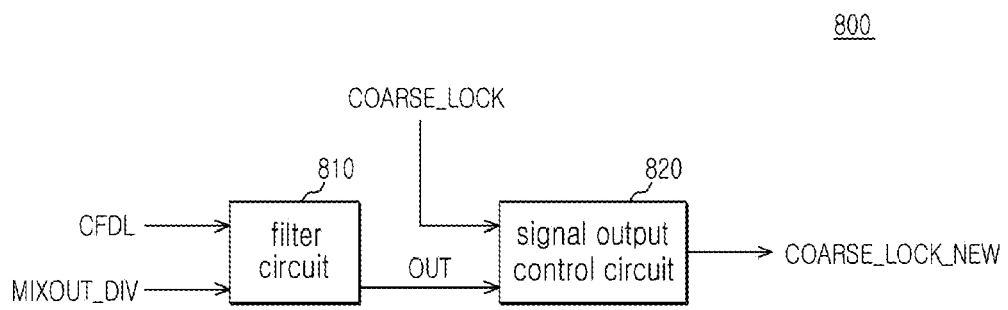
FIG. 4 is a block diagram illustrating an error decision unit that can be included in the circuit of FIG. 3.

As shown in FIG. 4, the error decision unit 800 can include a filter circuit 810 and a signal output control circuit 820.

The filter circuit 810 can be configured to activate a filtering signal 'OUT' when pulses of the delay control signal 'CFDL' occur a predetermined number of times while the divided signal 'MIXOUT_DIV' is activated.

The signal output control circuit 820 can be configured to output the first delay mode decision signal 'COARSE_LOCK', as the second delay mode decision signal 'COARSE_LOCK_NEW', when the filtering signal 'OUT' is activated, or to deactivate the second delay mode decision signal 'COARSE_LOCK_NEW' regardless of the first delay mode decision signal 'COARSE_LOCK'.

Figure 5:
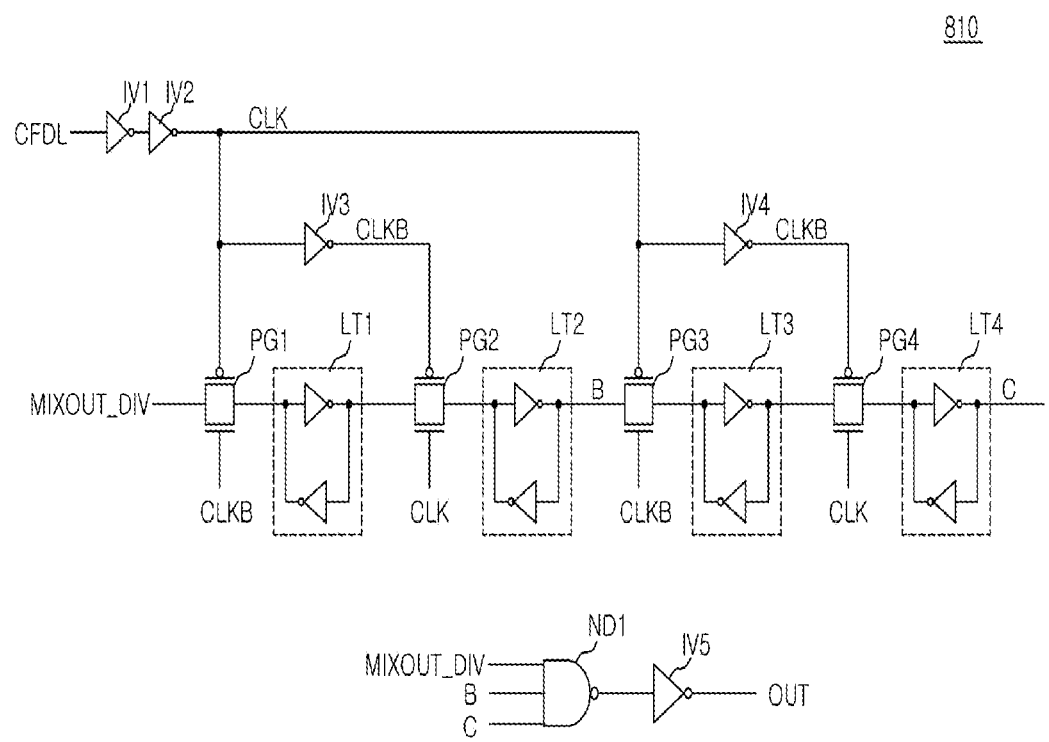
FIG. 5 is a circuit diagram illustrating a filter circuit that can be included in the unit of FIG. 4.

As shown in FIG. 5, the filter circuit 810 can include first to fifth inverters IV1 to IV5, first to fourth pass gates PG1 to PG4, first to fourth latches LT1 to LT4, and a NAND gate ND1.

The first and second inverters IV1 and IV2 can buffer the delay control signal 'CFDL'. The filter circuit 810 can use an output signal of the first and second inverters IV1 and IV2 as a clock signal 'CLK'. Accordingly, the output signal of the first and second inverters IV1 and IV2 can be called a clock signal 'CLK' within the filter circuit 810.

Each of the third inverter IV3 and the fourth inverter IV4 can invert the clock signal 'CLK', thereby producing an inverted clock signal 'CLKB'. An input terminal of the first pass gate PG1 can receive the divided signal 'MIXOUT_DIV', and an output terminal of the first pass gate PG1 can be connected to an input terminal of the first latch LT1. An input terminal of the second pass gate PG2 can be connected to an output terminal of the first latch LT1, and an output terminal of the second pass gate PG2 can be connected to an input terminal of the second latch LT2. An input terminal of the third pass gate PG3 can be connected to an output terminal of the second latch LT2, and an output terminal of the third pass gate PG3 can be connected to an input terminal of the third latch LT3. An input terminal of the fourth pass gate PG4 can be connected to an output terminal of the third latch LT3, and an output terminal of the fourth pass gate PG4 can be connected to an input terminal of the fourth latch LT4.

The NAND gate ND1 can receive the divided signal 'MIXOUT_DIV', an output signal 'B' of the second latch LT2, and an output signal 'C' of the fourth latch LT4. The fifth inverter IV5 can receive an output signal of the NAND gate ND1 and then output the filtering signal 'OUT'.

Figure 6:
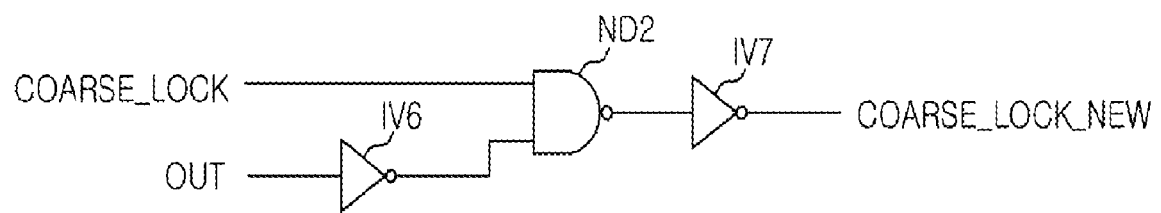
FIG. 6 is a circuit diagram illustrating a signal output control circuit that can be included in the unit of FIG. 4.

The filter circuit 810 can be configured to activate the filtering signal 'OUT' when the pulses of the delay control signal 'CFDL' occur more than three times while the divided signal 'MIXOUT_DIV' is activated. When there is no phase distortion in the reference clock signal 'REFCLK', then it can be assumed that the delay is finally locked by, for example, two-step adjustment in the fine delay line 220 after the delay is first locked in the coarse delay line 210. That is, it can be assumed that the pulses of the delay control signal 'CFDL' occur twice. The divided signal 'MIXOUT_DIV' can be produced by dividing the delay signal 'MIXOUT' of the delay line 200 into, for example, three signals. The divided signal 'MIXOUT_DIV' can be used for securing a section required to detect the pulse generation of the delay control signal 'CFDL' three times As shown in FIG. 6, the signal output control circuit 820 can include sixth and seventh inverters IV6 and IV7 and a second NAND gate ND2.

The sixth inverter IV6 can receive the filtering signal 'OUT'. The second NAND gate ND2 can receive the first delay mode decision signal 'COARSE_LOCK' and an output signal of the sixth inverter IV6. The seventh inverter IV7 can receive an output signal of the second NAND gate ND2 and then output the second delay mode decision signal 'COARSE_LOCK_NEW'.

The operation of the delay locked loop circuit 100 will now be described in detail below.

First, referring to FIG. 5, the divided signal 'MIXOUT_DIV', an output signal 'B' of the second latch LT2 and an output signal 'C' of the fourth latch LT4 cannot be activated in the filter circuit 810 before the delay control signal 'CFDL' occurs three times. The delay control signal 'CFDL' is generated only after the first delay mode decision signal 'COARSE_LOCK' is activated.

Therefore, the signal output control circuit 820 can output the first delay mode decision signal 'COARSE_LOCK' as the second delay mode decision signal 'COARSE_LOCK_NEW' because the filtering signal 'OUT' is deactivated, e.g., in a low level.

When the first delay mode decision signal 'COARSE_LOCK' is deactivated in a state where the filtering signal 'OUT' is deactivated in a low level, then the second delay mode decision signal 'COARSE_LOCK_NEW' is also deactivated.

Since the second delay mode decision signal 'COARSE_LOCK' is deactivated, the control unit 500 generates the delay control signal 'CCDL' according to the phase detection signal 'POUT'. When the pulse of the delay control signal 'CCDL' is generated, the coarse delay line 210 delays and outputs the reference clock signal 'REFCLK' in such a manner that the delay time is varied based on the generated pulse of the delay control signal 'CCDL'.

The phase detection unit 400 and the control unit 500 repeatedly operate according to the variation of output signals out of the coarse delay line 210.

On the other hand, when the first delay mode decision signal 'COARSE_LOCK' is activated in a state where the filtering signal 'OUT' is deactivated, e.g., in a low level, then the second delay mode decision signal 'COARSE_LOCK_NEW' is also activated.

Since the second delay mode decision signal 'COARSE_LOCK' is activated, the control unit 500 generates the delay control signal 'CFDL' according to the phase detection signal 'POUT'.

When the pulse of the delay control signal 'CFDL' is generated, the fine delay line 220 outputs the delay signal 'MIXOUT' by delaying the output signal of the coarse delay line 210 in such a manner that the delay time is varied based on the generated pulse of the delay control signal 'CFDL'.

The phase detection unit 400 and the control unit 500 repeatedly operate according to the variation of the delay signal 'MIXOUT'.

When phase distortion is not present in the reference clock signal 'REFCLK', then the filtering signal 'OUT' in FIG. 5 is continuously maintained in a deactivated state and the second delay mode decision signal 'COARSE_LOCK_NEW' is then maintained in an activated state, because the delay control signal 'CFDL' is not generated more than three times.

Meanwhile, when phase distortion is present due to variations in the operational environment, such as chances in frequency or voltage fluctuation, then the delay control signal 'CFDL' can be generated more than three times.

When the delay control signals 'CFDL' are generated more than three times, then the filtering signal 'OUT' of FIG. 5 is activated, e.g., in a high level.

Since the filtering signal 'OUT' is activated, the second delay mode decision signal 'COARSE_LOCK_NEW' is deactivated, e.g., in a low level regardless of the first delay mode decision signal 'COARSE_LOCK'.

Since the second delay mode decision signal 'COARSE_LOCK_NEW' is deactivated, the control unit 500 terminates the pulse generation of the delay control signal 'CFDL' and controls the coarse delay line 210 by producing the delay control signal 'CCDL' according to the phase detection signal 'POUT'.

As apparent from the above, a delay Locked Loop circuit configured in accordance with the embodiments described herein can reduce a locking time, which is required to execute the DLL operation, by detecting a case where the phase difference between the reference clock signal 'REFCLK' and the feedback clock signal 'FBCLK' is out of the adjustment range of the fine delay line 220 or it take a lot of time to adjust the delay time.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A delay locked loop circuit comprising:
a delay line configured to delay and output a reference clock signal;
a phase detection unit coupled with the delay line, the phase detection unit configured to detect a phase difference between the reference clock signal and an output signal of the delay line and output a phase detection signal and a first delay mode decision signal according to the phase difference;
a control unit coupled with the delay line and the phase detection unit, the control unit configured to output a delay control signal to control the delay line according to the phase detection signal and a second delay mode decision signal; and
an error decision unit coupled with the control unit and the phase detection unit, the error detection circuit configured to detect an error of the first delay mode decision signal according to the delay control signal and the output signal of the delay line and output the second delay mode decision signal according to a result of the error detection.

2. The delay locked loop circuit of claim 1, wherein the delay control signal includes first and second delay control signals and wherein the delay line includes:
a first delay line configured to delay the reference clock signal by a predetermined delay time according to the first delay control signal; and
a second delay line configured to delay an output signal of the first delay line by a predetermined delay time according to the second delay control signal, wherein a unit delay time of the second delay line is shorter than that of the first delay line.

3. The delay locked loop circuit of claim 2, wherein the control unit is further configured to output the first delay control signal to control the first delay line when the second delay mode decision signal is deactivated and output the second delay control signal to control the second delay line when the second delay mode decision signal is activated.

4. The delay locked loop circuit of claim 3, wherein the control unit is further configured to output pulse signals for the first and second delay control signals respectively.

5. The delay locked loop circuit of claim 4, wherein the error decision unit is further configured to output the first delay mode decision signal as the second delay mode decision signal, when the pulse signals of the second delay control signal occurs less than a predetermined number of times while a divided signal, which is produced by dividing an output signal of the second delay line, is activated.

6. The delay locked loop circuit of claim 5, wherein the delay locked loop circuit further comprising a divider for generating the divided signal by dividing a final output signal of the second delay line.

7. The delay locked loop circuit of claim 4, wherein the error decision unit is further configured to deactivate the second delay mode decision signal regardless of the first delay mode decision signal, when the pulse signals of the second delay control signal occur more than a predetermined number of times while a divided signal, which is produced by dividing an output signal of the second delay line, is activated.

8. The delay locked loop circuit of claim 4, wherein the error decision unit includes:

a filter circuit configured to activate a filtering signal when the pulse signals of the second delay control signal occur more than a predetermined number of times while a divided signal, which is produced by dividing an output signal of the second delay line, is activated; and a signal output control circuit configured to pass through the first delay mode decision signal or block the first delay mode decision signal according to the filtering signal.

9. The delay locked loop circuit of claim 8, wherein the filter circuit includes:

a pass gate array configured to pass the divided signal according to the second delay control signal;

a plurality of latches connected between a plurality of pass gates in the pass gate array; and a first logic circuit configured to output the filtering signal by combining the divided signal and signals stored in a part of the plurality of latches.

10. The delay locked loop circuit of claim 8, wherein the signal output control circuit includes a second logic circuit configured to output the second delay mode decision signal by ORing the filtering signal and the first delay mode decision signal.

11. A method for controlling a delay locked loop circuit comprising:

executing a first DLL(Delay Locked Loop) operation by controlling one of a plurality of delay lines;

deciding whether the first DLL operation is completed within a predetermined time or not; and executing a second DLL operation by controlling another of the plurality of the delay lines when the first DLL operation is not completed within the predetermined time, wherein the deciding whether the first DLL operation is completed within a predetermined time or not includes deciding whether control signals to control the first DLL operation occur more than a predetermined number of times.

12. The method of claim 11, wherein a unit delay time of one of the plurality of the delay lines is shorter than that of the others of the plurality of the delay lines.

13. The method of claim 11, wherein the deciding whether the first DLL operation is completed within a predetermined time or not includes deciding whether the control signals to control the first DLL operation occur more than a predetermined number of times while a final output signal of the plurality of the delay lines is activated.

14. The method of claim 11, wherein the deciding whether the first DLL operation is completed within a predetermined time or not includes deciding whether the control signals to control the first DLL operation occur more than a predetermined number of times while a divided signal, which is produced by dividing a final output signal of the plurality of the delay lines, is activated.

* * * * *